United States Patent
Shin et al.

(10) Patent No.: US 11,818,926 B2
(45) Date of Patent: Nov. 14, 2023

(54) DISPLAY DEVICE HAVING A PLURALITY OF DISCHARGE HOLES

(71) Applicant: Samsung Display Co., LTD., Yongin-si (KR)

(72) Inventors: Kwangsik Shin, Cheonan-si (KR); Tae Wook Kim, Seoul (KR); Joohong Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 232 days.

(21) Appl. No.: 17/320,161

(22) Filed: May 13, 2021

(65) Prior Publication Data

US 2022/0115488 A1 Apr. 14, 2022

(30) Foreign Application Priority Data

Oct. 8, 2020 (KR) .................... 10-2020-0130284

(51) Int. Cl.
*H10K 59/131* (2023.01)
*H10K 59/121* (2023.01)

(52) U.S. Cl.
CPC ......... *H10K 59/131* (2023.02); *H10K 59/121* (2023.02)

(58) Field of Classification Search
None
See application file for complete search history.

(56) References Cited

U.S. PATENT DOCUMENTS

| 7,482,598 | B2 | 1/2009 | Low et al. |
| 7,560,369 | B2 | 7/2009 | Kim |
| 9,923,170 | B2 | 3/2018 | Kim et al. |
| 10,312,309 | B2 * | 6/2019 | Lin ...................... H10K 59/131 |
| 2016/0133874 | A1 * | 5/2016 | Kim ...................... H10K 59/10 438/23 |
| 2018/0004047 | A1 * | 1/2018 | Yamazaki ............. G02F 1/1333 |
| 2020/0176538 | A1 * | 6/2020 | Um ...................... H10K 59/131 |

FOREIGN PATENT DOCUMENTS

| KR | 100640979 | 11/2006 |
| KR | 101088428 | 12/2011 |
| KR | 20160055333 | 5/2016 |
| KR | 20180049005 | 5/2018 |
| KR | 20180068011 | 6/2018 |
| KR | 20200066503 | 6/2020 |

* cited by examiner

*Primary Examiner* — Ryan Crockett
(74) *Attorney, Agent, or Firm* — H.C. Park & Associates, PLC

(57) ABSTRACT

A display device may include a substrate including a display area and a non-display area surrounding at least a portion of the display area, a first organic insulating layer disposed on the substrate in the non-display area, a first conductive layer disposed on the first organic insulating layer and including first discharge holes, a second organic insulating layer disposed on the first conductive layer, and a transparent conductive layer disposed on the second organic insulating layer and including second discharge holes that respectively overlap the first discharge holes.

20 Claims, 8 Drawing Sheets

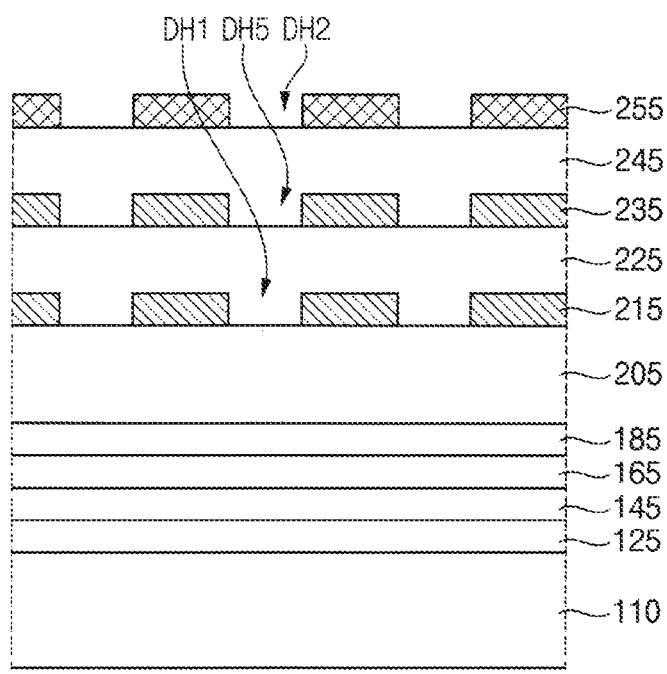

DISPLAY DEVICE HAVING A PLURALITY OF DISCHARGE HOLES

CROSS REFERENCE TO RELATED APPLICATION(S)

This application claims priority from and the benefit of Korean Patent Application No. 10-2020-0130284, filed on Oct. 8, 2020, which is hereby incorporated by reference for all purposes as if fully set forth herein.

BACKGROUND

Field

Embodiments of the invention relate generally to a display device.

Discussion Of The Background

A display device may include a light emitting element including a hole injection electrode, an electron injection electrode, and an emission layer disposed therebetween. The light emitting element may emit light when excitons generated by combining holes injected from the hole injection electrode and electrons injected from the electron injection electrode in the emission layer fall from an excited state to a ground state.

The display device may include an inorganic insulating layer and/or an organic insulating layer to insulate between stacked conductive layers. Due to short-term or long-term chemical decomposition of organic materials contained in the organic insulating layer, the organic insulating layer may generate gas. When the gas generated in the organic insulating layer flows into the light emitting element, pixel shrinkage, dark spots, or the like may be induced.

The above information disclosed in this Background section is only for understanding of the background of the inventive concepts, and, therefore, it may contain information that does not constitute prior art.

SUMMARY

Embodiments provide a display device configured to prevent a light emitting element from being damaged.

Additional features of the inventive concepts will be set forth in the description which follows, and in part will be apparent from the description, or may be learned by practice of the inventive concepts.

A display device according to an embodiment may include a substrate including a display area and a non-display area surrounding at least a portion of the display area, a first organic insulating layer disposed on the substrate in the non-display area, a first conductive layer disposed on the first organic insulating layer and including first discharge holes, a second organic insulating layer disposed on the first conductive layer, and a transparent conductive layer disposed on the second organic insulating layer and including second discharge holes that respectively overlap the first discharge holes.

In an embodiment, a width of each of the second discharge holes may be substantially equal to a width of each of the first discharge holes.

In an embodiment, the first conductive layer may include aluminum (Al) and titanium (Ti).

In an embodiment, the transparent conductive layer may include silver (Ag) and indium tin oxide (ITO).

In an embodiment, each of the first organic insulating layer and the second organic insulating layer may include polyimide (PI).

In an embodiment, the display device may further include pixels disposed on the substrate in the display area and a power line disposed on the substrate in the non-display area, providing a power voltage to the pixels, and including the first conductive layer and the transparent conductive layer.

In an embodiment, the power line may include a first portion spaced apart from the display area by a first distance and a second portion spaced apart from the display area by a second distance greater than the first distance. The first discharge holes and the second discharge holes may be disposed in the first portion.

In an embodiment, the first conductive layer may further include third discharge holes. The second conductive layer may further include fourth discharge holes that do not respectively overlap the third discharge holes. The third discharge holes and the fourth discharge holes may be disposed in the second portion.

In an embodiment, the third discharge holes and the fourth discharge holes may be alternately disposed in a plan view.

In an embodiment, the non-display area may include a first side portion in which a pad connected to the power line is disposed, a corner portion extending from the first side portion and having a curved shape, and a second side portion extending from the corner portion and having a straight shape. The first portion may be disposed in the first side portion.

In an embodiment, the second portion may be disposed in the corner portion.

In an embodiment, the second portion may be disposed in the second side portion.

In an embodiment, the display device may further include a transistor disposed on the substrate in the display area, a first planarization layer disposed on the transistor, a first connection electrode disposed on the first planarization layer and connected to the transistor, a second planarization layer disposed on the first connection electrode, a pixel electrode disposed on the second planarization layer and connected to the first connection electrode, an emission layer disposed on the pixel electrode, and an opposite electrode disposed on the emission layer.

In an embodiment, the first organic insulating layer may be disposed on the same layer as the first planarization layer. The first conductive layer may be disposed on the same layer as the first connection electrode. The second organic insulating layer may be disposed on the same layer as the second planarization layer. The transparent conductive layer may be disposed on the same layer as the pixel electrode.

In an embodiment, the display device may further include a second conductive layer disposed between the second organic insulating layer and the transparent conductive layer and including fifth discharge holes that respectively overlap the first discharge holes, and a third organic insulating layer disposed between the second conductive layer and the transparent conductive layer.

In an embodiment, the second conductive layer may include aluminum (Al) and titanium (Ti).

In an embodiment, the third organic insulating layer may include polyimide (PI).

In an embodiment, the display device may further include a second connection electrode disposed between the second planarization layer and the pixel electrode and connecting the first connection electrode and the pixel electrode, and a third planarization layer disposed between the second connection electrode and the pixel electrode.

In an embodiment, the second conductive layer may be disposed on the same layer as the second connection electrode. The third organic insulating layer may be disposed on the same layer as the third planarization layer.

In an embodiment, the transparent conductive layer may be connected to the opposite electrode.

In the display device according to the embodiments, the second discharge holes of the transparent conductive layer may respectively overlap the first discharge holes of the first conductive layer, so that gases generated in the first organic insulating layer disposed in the non-display area may be smoothly discharged through the first discharge holes and the second discharge holes. Accordingly, the light emitting element disposed in the display area may not be damaged by the gases discharged from the first organic insulating layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 9 and 10 are cross-sectional views illustrating a display device according to an embodiment.

DETAILED DESCRIPTION OF THE EMBODIMENTS

Figure 1:
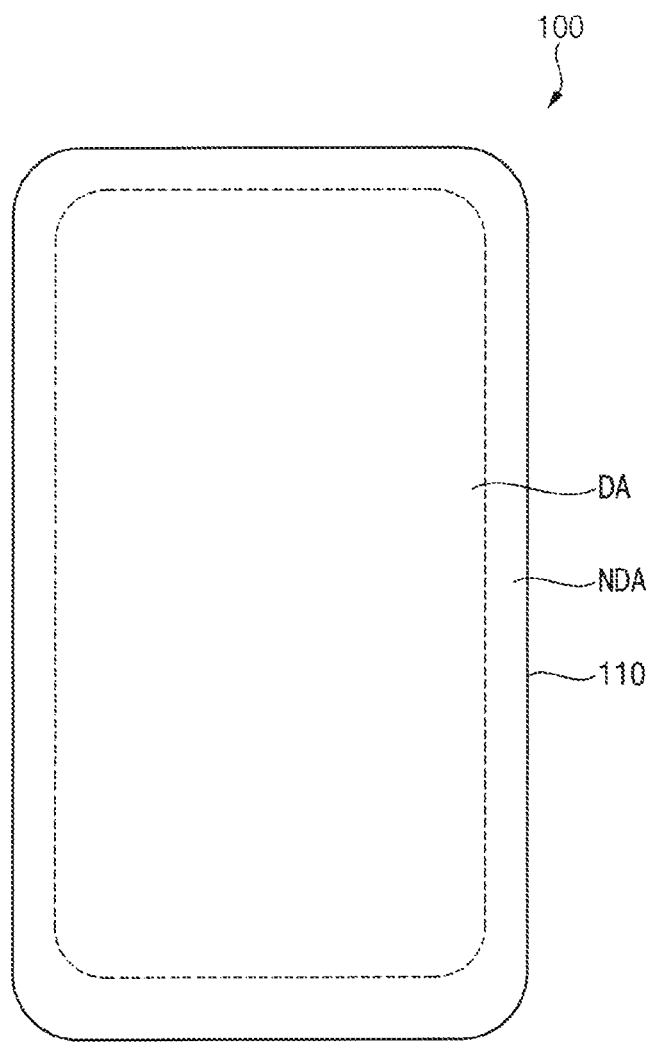
FIG. 1 is a plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices in accordance with embodiments will be explained in detail with reference to the accompanying drawings.

FIG. 1 is a plan view illustrating a display device according to an embodiment.

Referring to FIG. 1, a display device 100 according to an embodiment may include a substrate 110 including a display area DA and a non-display area NDA. The display area DA may be an area that displays an image.

The non-display area NDA may surround at least a portion of the display area DA. In an embodiment, the non-display area NDA may entirely surround the display area DA. The non-display area NDA may be an area that does not display an image.

Figure 2:
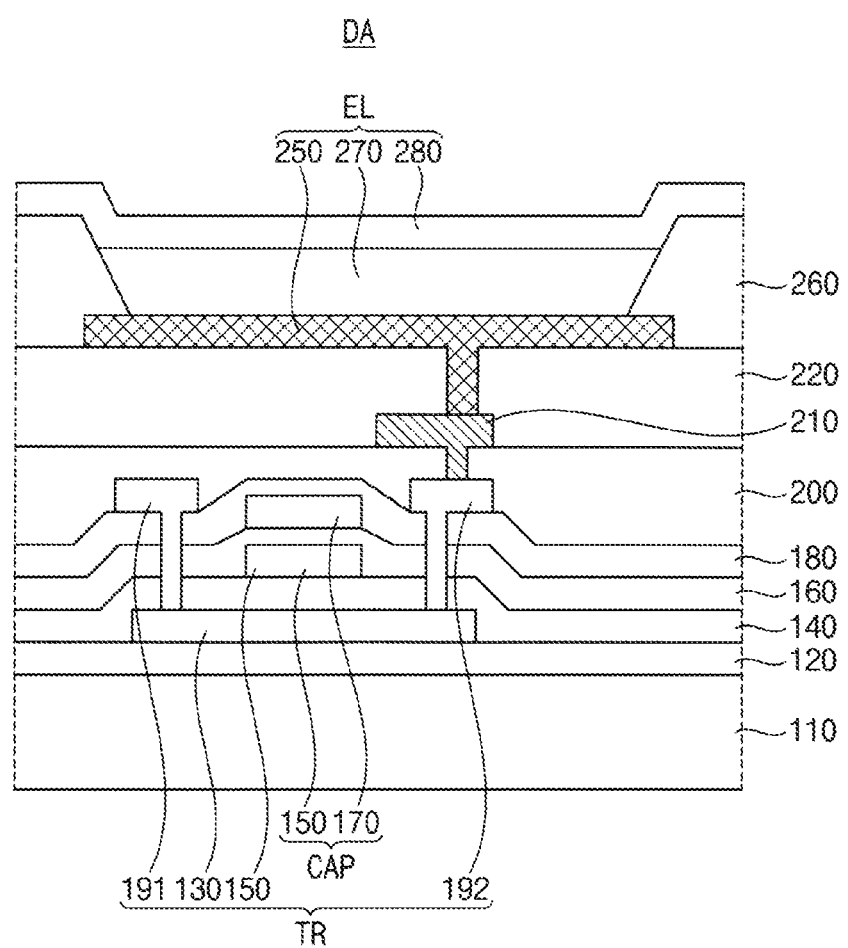
FIG. 2 is a cross-sectional view illustrating a display area in FIG. 1.

FIG. 2 is a cross-sectional view illustrating the display area DA in FIG. 1.

Referring to FIGS. 1 and 2, the display device 100 may include a buffer layer 120, an active layer 130, a first gate insulating layer 140, a gate electrode 150, a second gate insulating layer 160, a second gate electrode 170, an interlayer insulating layer 180, a source electrode 191, a drain electrode 192, a first planarization layer 200, a first connection electrode 210, a second planarization layer 220, a pixel electrode 250, a pixel defining layer 260, an emission layer 270, and an opposite electrode 280 disposed on the substrate 110 in the display area DA.

The substrate 110 may be a transparent insulating substrate. In an embodiment, the substrate 110 may have rigid characteristics. In such an embodiment, the substrate 110 may include, for example, glass, quartz, metal, or the like. In another embodiment, the substrate 110 may have flexible characteristics. In such another embodiment, the substrate 110 may include polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like.

The buffer layer 120 may be disposed on the substrate 110. The buffer layer 120 may block impurities from flowing through the substrate 110. Further, the buffer layer 120 may provide a flat upper surface on the substrate 110. The buffer layer 120 may include an inorganic insulating material such as silicon nitride, silicon oxide, silicon oxynitride, or the like.

The active layer 130 may be disposed on the buffer layer 120. In an embodiment, the active layer 130 may include amorphous silicon, polycrystalline silicon, or the like. In another embodiment, the active layer 130 may include an oxide semiconductor. For example, the oxide semiconductor may include at least one oxide of indium (In), gallium (Ga), zinc (Zn), tin (Sn), titanium (Ti), zirconium (Zr), and hafnium (Hf).

The first gate insulating layer 140 may be disposed on the active layer 130. The first gate insulating layer 140 may cover the active layer 130 on the buffer layer 120. In an embodiment, the first gate insulating layer 140 may have a uniform thickness along the profile of the active layer 130. In another embodiment, the first gate insulating layer 140 may have a flat upper surface. The first gate insulating layer 140 may include an inorganic insulating material such as silicon nitride, silicon oxide, silicon oxynitride, or the like.

The first gate electrode 150 may be disposed on the first gate insulating layer 140. The first gate electrode 150 may overlap the active layer 130. The first gate electrode 150 may include a conductive material such as molybdenum (Mo), copper (Cu), aluminum (Al), titanium (Ti), or the like.

The second gate insulating layer 160 may be disposed on the first gate electrode 150. The second gate insulating layer 160 may cover the first gate electrode 150 on the first gate insulating layer 140. In an embodiment, the second gate insulating layer 160 may have a uniform thickness along the profiles of the first gate insulating layer 140 and the first gate electrode 150. In another embodiment, the second gate insulating layer 160 may have a flat upper surface. The second gate insulating layer 160 may include an inorganic insulating material such as silicon nitride, silicon oxide, silicon oxynitride, or the like.

The second gate electrode 170 may be disposed on the second gate insulating layer 160. The second gate electrode 170 may overlap the first gate electrode 150. The second gate electrode 170 may include a conductive material such as molybdenum (Mo), copper (Cu), aluminum (Al), titanium (Ti), or the like. The first gate electrode 150 and the second gate electrode 170 may form a capacitor CAP.

The interlayer insulating layer 180 may be disposed on the second gate electrode 170. The interlayer insulating layer 180 may cover the second gate electrode 170 on the second gate insulating layer 160. In an embodiment, the interlayer insulating layer 180 may have a uniform thickness along the profiles of the second gate insulating layer 160 and the second gate electrode 170. In another embodiment, the interlayer insulating layer 180 may have a flat upper surface.

The interlayer insulating layer 180 may include an inorganic insulating material such as silicon nitride, silicon oxide, silicon oxynitride, or the like.

The source electrode 191 and the drain electrode 192 may be disposed on the interlayer insulating layer 180. Each of the source electrode 191 and the drain electrode 192 may be connected to the active layer 130 through a contact hole formed in the first gate insulating layer 140, the second gate insulating layer 160, and the interlayer insulating layer 180. Each of the source electrode 191 and the drain electrode 192 may include a conductive material such as molybdenum (Mo), copper (Cu), aluminum (Al), titanium (Ti), or the like. The active layer 130, the first gate electrode 150, the source electrode 191, and the drain electrode 192 may form a transistor TR.

In an embodiment, as illustrated in FIG. 2, the transistor TR may have a top-gate type structure in which the gate electrode 150 is disposed on the active layer 130. However, the present invention is not limited thereto, and in another embodiment, the transistor TR may have a bottom-gate type structure in which the gate electrode is disposed under the active layer.

The first planarization layer 200 may be disposed on the source electrode 191 and the drain electrode 192. The first planarization layer 200 may cover the source electrode 191 and the drain electrode 192 on the interlayer insulating layer 180. The first planarization layer 200 may have a flat upper surface. The first planarization layer 200 may include an organic insulating material such as polyimide (PI) or the like.

The first connection electrode 210 may be disposed on the first planarization layer 200. The first connection electrode 210 may be connected to the source electrode 191 or the drain electrode 192 through a contact hole formed in the first planarization layer 200. In an embodiment, as illustrated in FIG. 2, the first connection electrode 210 may be connected to the drain electrode 192. However, the present invention is not limited thereto, and in another embodiment, the first connection electrode 210 may be connected to the source electrode 191.

The first connection electrode 210 may include a conductive material such as molybdenum (Mo), copper (Cu), aluminum (Al), titanium (Ti), or the like. In an embodiment, the first connection electrode 210 may include aluminum (Al) and titanium (Ti). For example, the first connection electrode 210 may have a multilayer structure including a titanium (Ti) layer, an aluminum (Al) layer, and a titanium (Ti) layer that are sequentially stacked.

The second planarization layer 220 may be disposed on the first connection electrode 210. The second planarization layer 220 may cover the first connection electrode 210 on the first planarization layer 200. The second planarization layer 220 may have a flat upper surface. The second planarization layer 220 may include an organic insulating material such as polyimide (PI) or the like.

The pixel electrode 250 may be disposed on the second planarization layer 220. The pixel electrode 250 may be connected to the first connection electrode 210 through a contact hole formed in the second planarization layer 220. The pixel electrode 250 may include a conductive material such as a metal, an alloy, a transparent conductive oxide, or the like. In an embodiment, the pixel electrode 250 may include silver (Ag) and indium tin oxide (ITO). For example, the pixel electrode 250 may have a multilayer structure including an indium tin oxide (ITO) layer, a silver (Ag) layer, and an indium tin oxide (ITO) layer that are sequentially stacked.

The pixel defining layer 260 may be disposed on the pixel electrode 250. The pixel defining layer 260 may partially cover the pixel electrode 250 on the second planarization layer 220. The pixel defining layer 260 may have a pixel opening exposing at least a portion of the pixel electrode 250. In an embodiment, the pixel opening may expose a central portion of the pixel electrode 250, and the pixel defining layer 260 may cover a peripheral portion of the pixel electrode 250. The pixel defining layer 260 may have a flat upper surface. The pixel defining layer 260 may include an organic insulating material such as polyimide (PI) or the like.

The emission layer 270 may be disposed on the pixel electrode 250. The emission layer 270 may be disposed on the pixel electrode 250 exposed by the pixel opening. The emission layer 270 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, diphenylbenzidine (N,N'-diphenylbenzidine), tris-(8-hydroxyquinoline)aluminum), or the like. The high molecular organic compound may include polyethylenedioxythiophene, polyaniline, poly-phenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer to maintain semiconductor properties by preventing chemical modification of the core, and as a charging layer configured to impart electrophoretic properties to the quantum dots.

The opposite electrode 280 may be disposed on the emission layer 270. In an embodiment, the opposite electrode 280 may also be disposed on the pixel defining layer 260. The opposite electrode 280 may include a conductive material such as a metal, an alloy, a transparent conductive oxide, or the like. For example, the conductive material may include aluminum (Al), platinum (Pt), silver (Ag), magnesium (Mg), gold (Au), chromium (Cr), tungsten (W), titanium (Ti), or the like. The pixel electrode 250, the emission layer 270, and the opposite electrode 280 may form the light emitting element EL.

Figure 3:
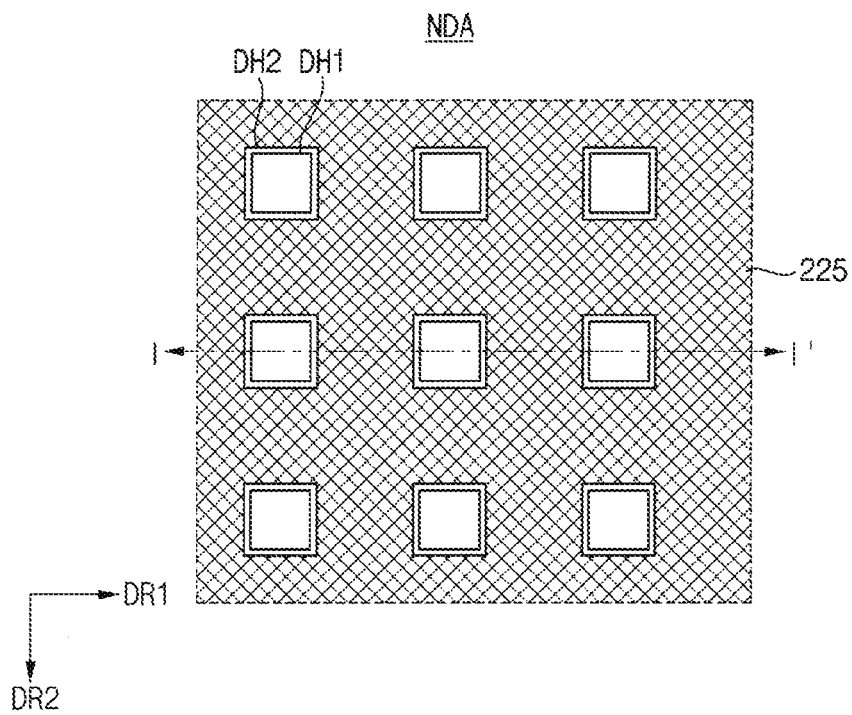
FIG. 3 is a plan view illustrating a non-display area in FIG. 1.
Figure 4:
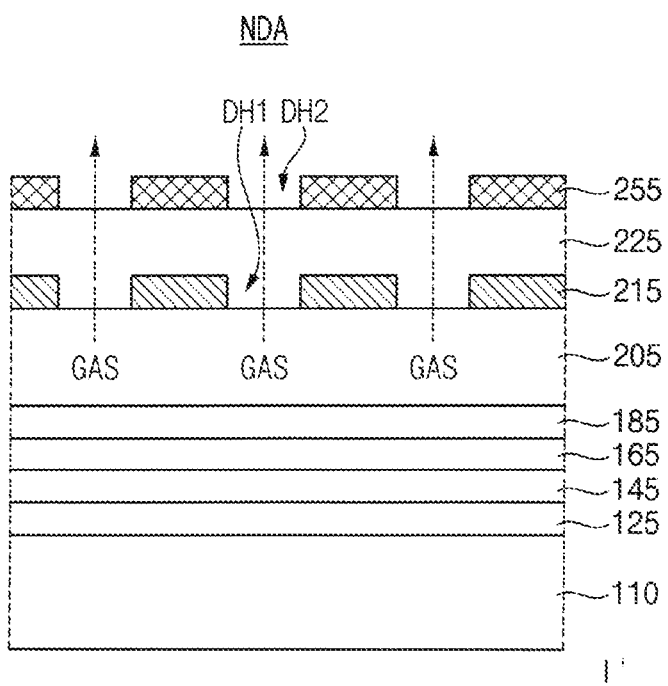
FIG. 4 is a cross-sectional view illustrating the display device taken along a line I-I' in FIG. 3.

FIG. 3 is a plan view illustrating the non-display area in FIG. 1. FIG. 4 is a cross-sectional view illustrating the display device 100 taken along a line I-I' in FIG. 3.

Referring to FIGS. 1, 3, and 4, the display device 100 may include a first inorganic insulating layer 125, a second inorganic insulating layer 145, a third inorganic insulating layer 165, a fourth inorganic insulating layer 185, a first organic insulating layer 205, a first conductive layer 215, a second organic insulating layer 225, and a transparent conductive layer 255 disposed on the substrate 110 in the non-display area NDA.

The first inorganic insulating layer 125 may be disposed on the substrate 110. The first inorganic insulating layer 125 may include an inorganic insulating material such as silicon nitride, silicon oxide, silicon oxynitride, or the like. In an embodiment, the first inorganic insulating layer 125 may be disposed on the same layer as the buffer layer 120. In such an embodiment, the material of the first inorganic insulating layer 125 may be substantially the same as the material of the buffer layer 120.

The second inorganic insulating layer 145 may be disposed on the first inorganic insulating layer 125. The second inorganic insulating layer 145 may include an inorganic insulating material such as silicon nitride, silicon oxide, silicon oxynitride, or the like. In an embodiment, the second inorganic insulating layer 145 may be disposed on the same layer as the first gate insulating layer 140. In such an embodiment, the material of the second inorganic insulating layer 145 may be substantially the same as the material of the first gate insulating layer 140.

The third inorganic insulating layer 165 may be disposed on the second inorganic insulating layer 145. The third inorganic insulating layer 165 may include an inorganic insulating material such as silicon nitride, silicon oxide, silicon oxynitride, or the like. In an embodiment, the third inorganic insulating layer 165 may be disposed on the same layer as the second gate insulating layer 160. In such an embodiment, the material of the third inorganic insulating layer 165 may be substantially the same as the material of the second gate insulating layer 160.

The fourth inorganic insulating layer 185 may be disposed on the third inorganic insulating layer 165. The fourth inorganic insulating layer 185 may include an inorganic insulating material such as silicon nitride, silicon oxide, silicon oxynitride, or the like. In an embodiment, the fourth inorganic insulating layer 185 may be disposed on the same layer as the interlayer insulating layer 180. In such an embodiment, the material of the fourth inorganic insulating layer 185 may be substantially the same as the material of the interlayer insulating layer 180.

The first organic insulating layer 205 may be disposed on the fourth inorganic insulating layer 185. The first organic insulating layer 205 may include an organic insulating material such as polyimide (PI) or the like. In an embodiment, the first organic insulating layer 205 may be disposed on the same layer as the first planarization layer 200. In such an embodiment, the material of the first organic insulating layer 205 may be substantially the same as the material of the first planarization layer 200.

The first conductive layer 215 may be disposed on the first organic insulating layer 205. The first conductive layer 215 may include a conductive material such as molybdenum (Mo), copper (Cu), aluminum (Al), titanium (Ti), or the like. In an embodiment, the first conductive layer 215 may include aluminum (Al) and titanium (Ti). For example, the first conductive layer 215 may have a multilayer structure including a titanium (Ti) layer, an aluminum (Al) layer, and a titanium (Ti) layer that are sequentially stacked.

In an embodiment, the first conductive layer 215 may be disposed on the same layer as the first connection electrode 210. In such an embodiment, the material of the first conductive layer 215 may be substantially the same as the material of the first connection electrode 210.

The first conductive layer 215 may include first discharge holes DH1. The first discharge holes DH1 may pass through the first conductive layer 215. The first discharge holes DH1 may be arranged at constant intervals in the first direction DR1 and the second direction DR2 crossing the first direction DR1 in a plan view. In an embodiment, each of the first discharge holes DH1 may have a rectangular planar shape. However, the present invention is not limited thereto, and in another embodiment, the planar shape of each of the first discharge holes DH1 may be a polygonal shape, a circular shape, etc. other than the rectangular shape.

The first discharge holes DH1 may serve as a passage to discharge gas generated in the first organic insulating layer 205. In the first organic insulating layer 205 including an organic insulating material, the gas may be generated by short-term or long-term chemical decomposition of moisture or the like. If the gas is not properly discharged, the light emitting element EL disposed in the display area DA may be damaged by the gas, which may cause a pixel shrinkage and a reduction in the lifespan of the light emitting element EL. The first discharge holes DH1 may be formed in the first conductive layer 215, so that the gas generated in the first organic insulating layer 205 may be discharged through the first discharge holes DH1 and through the layers above the first conductive layer 215.

The second organic insulating layer 225 may be disposed on the first conductive layer 215. The second organic insulating layer 225 may cover the first conductive layer 215 on the first organic insulating layer 205. The second organic insulating layer 225 may include an organic insulating material such as polyimide (PI) or the like. In an embodiment, the second organic insulating layer 225 may be disposed on the same layer as the second planarization layer 220. In such an embodiment, the material of the second organic insulating layer 225 may be substantially the same as the material of the second planarization layer 220.

The transparent conductive layer 255 may be disposed on the second organic insulating layer 225. The transparent conductive layer 255 may include a conductive material such as a metal, an alloy, a transparent conductive oxide, or the like. In an embodiment, the transparent conductive layer 255 may include silver (Ag) and indium tin oxide (ITO). For example, the transparent conductive layer 255 may have a multilayer structure including an indium tin oxide (ITO) layer, a silver (Ag) layer, and an indium tin oxide (ITO) layer that are sequentially stacked.

In an embodiment, the transparent conductive layer 255 may be disposed on the same layer as the pixel electrode 250. In such an embodiment, the material of the transparent conductive layer 255 may be substantially the same as the material of the pixel electrode 250.

The transparent conductive layer 255 may include second discharge holes DH2. The second discharge holes DH2 may pass through the transparent conductive layer 255. The second discharge holes DH2 may be arranged at constant intervals in the first direction DR1 and the second direction DR2 in the plan view. In an embodiment, each of the second discharge holes DH2 may have a rectangular planar shape. However, the present invention is not limited thereto, and in another embodiment, the planar shape of each of the second discharge holes DH2 may be a polygonal shape, a circular shape, etc. other than the rectangular shape.

The second discharge holes DH2 may serve as a passage to discharge gas generated from the first organic insulating layer 205 and/or the second organic insulating layer 225. In the second organic insulating layer 225 including an organic insulating material, the gas may be generated by short-term or long-term chemical decomposition of moisture or the like. If the gas is not properly discharged, the light emitting element EL disposed in the display area DA may be damaged by the gas, which may cause a pixel shrinkage and a reduction in the lifespan of the light emitting element EL. The second discharge holes DH2 may be formed in the transparent conductive layer 255, so that the gas generated in the first organic insulating layer 205 and/or the second organic insulating layer 225 may be discharged through the second discharge holes DH2.

The second discharge holes DH2 may respectively overlap the first discharge holes DH1. In an embodiment, a width of each of the second discharge holes DH2 may be substantially equal to a width of each of the first discharge holes DH1.

In previous designs, the second discharge holes formed in the transparent conductive layer may not respectively overlap or may respectively partially overlap the first discharge holes formed in the first conductive layer. In this case, a path through which gas is discharged may be bent, and thus, gas generated in the first organic insulating layer may not be smoothly discharged through the first discharge holes and the second discharge holes. Accordingly, the light emitting element disposed in the display area may be damaged by the gas.

However, in the embodiments of the present invention, the second discharge holes DH2 formed in the transparent conductive layer 255 may respectively overlap, substantially entirely lining up with, the first discharge holes DH1 formed in the first conductive layer 215. In this case, a path through which gas is discharged may be formed in a vertical direction, and accordingly, gas generated in the first organic insulating layer 205 may be smoothly discharged through the first discharge holes DH1 and the second discharge holes DH2. Accordingly, the light emitting element EL disposed in the display area DA may not be damaged by the gas.

Figure 5:
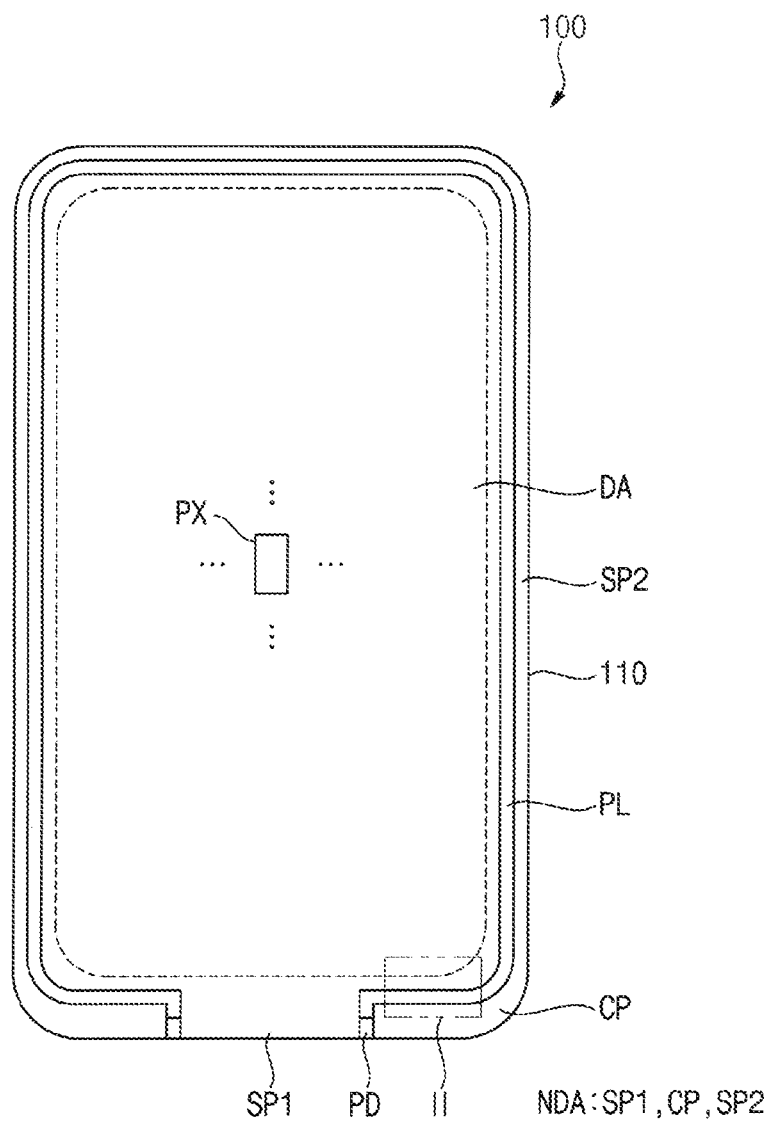
FIG. 5 is a plan view illustrating a display device according to an embodiment.
Figure 6:
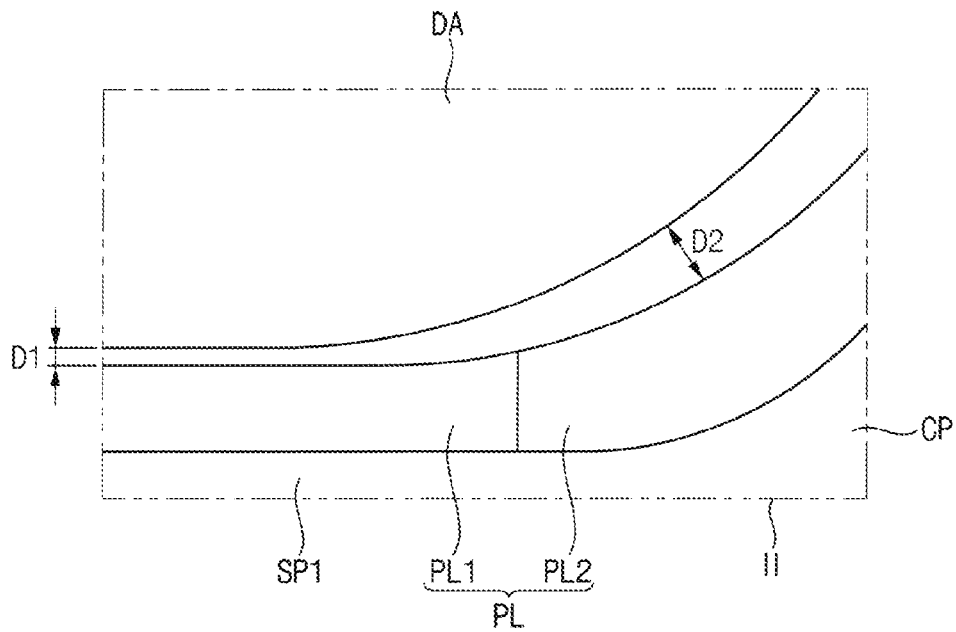
FIG. 6 is a plan view illustrating an area II in FIG. 5.

FIG. 5 is a plan view illustrating a display device according to an embodiment. FIG. 6 is a plan view illustrating an area II in FIG. 5.

Referring to FIGS. 5 and 6, the display device 100 according to an embodiment may include pixels PX disposed on the substrate 110 in the display area DA, and a pad PD and a power line PL disposed on the substrate 110 in the non-display area NDA.

The pixels PX may be arranged in a substantially matrix form on the substrate 110 in the display area DA. In an embodiment, each of the pixels PX may include the transistor TR, the capacitor CAP, and the light emitting element EL illustrated in FIG. 2.

The non-display area NDA may include a first side portion SP1, a corner portion CP extending from the first side portion SP1, and a second side portion SP2 extending from the corner portion CP. Each of the first side portion SP1 and the second side portion SP2 may have a straight shape, and the corner portion CP may have a curved shape. In an embodiment, the first side portion SP1 may correspond to a short side of the substrate 110, and the second side portion SP2 may correspond to a long side of the substrate 110.

The pad PD may be disposed on the substrate 110 in the first side portion SP1. The pad PD may be connected to a flexible printed circuit board or the like to receive a power voltage from the flexible printed circuit board.

The power line PL may be disposed on the substrate 110 in the non-display area NDA, and may entirely surround the display area DA. The power line PL may be connected to the pad PD, and may extend along the first side portion SP1, the corner portion CP, and the second side portion SP2. In an embodiment, the power line PL may include the first conductive layer 215 and the transparent conductive layer 255 illustrated in FIGS. 3 and 4.

The power line PL may receive the power voltage from the pad PD, and may provide the power voltage to the pixels PX. The power line PL may be connected to the pixels PX in the second side portion SP2. In an embodiment, the transparent conductive layer 255 of the power line PL may be connected to the opposite electrode 280 in FIG. 2 of the light emitting element EL of each of the pixels PX.

In an embodiment, the power line PL may include a first portion PL1 and a second portion PL2. The first portion PL1 may be spaced apart from the display area DA by a first distance D1, and the second portion PL2 may be spaced apart from the display area DA by a second distance D2 greater than the first distance D1. In other words, the second portion PL2 may be farther from the display area DA than the first portion PL1. The first portion PL1 may be substantially straight and slightly curved near a boundary with the second portion PL2. The second portion PL2 may be substantially curved and extend toward the second side portion SP2.

In an embodiment, the first portion PL1 may be disposed on the substrate 110 in the first side portion SP1. Further, the second portion PL2 may be disposed on the substrate 110 in the corner portion CP and/or the second side portion SP2.

Figure 7:
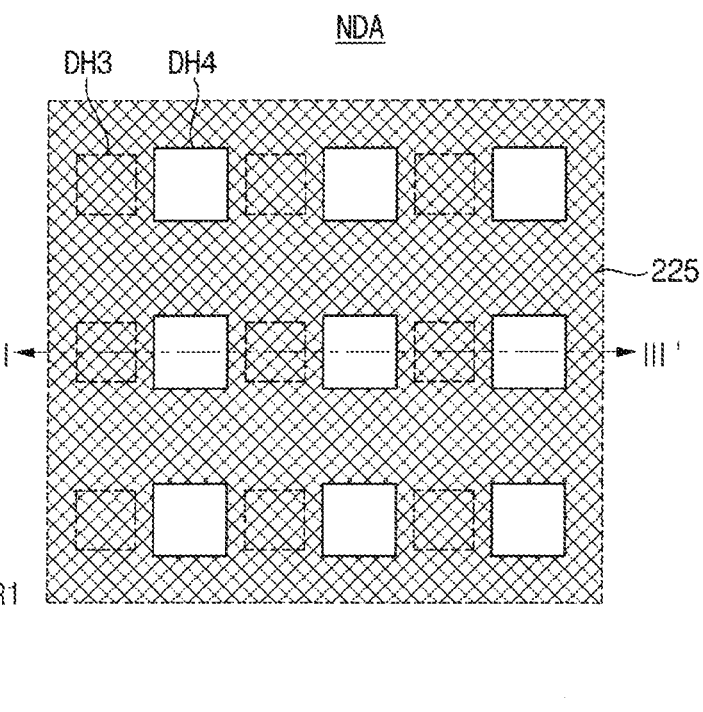
FIG. 7 is a plan view illustrating a non-display area in FIG. 5.
Figure 8:
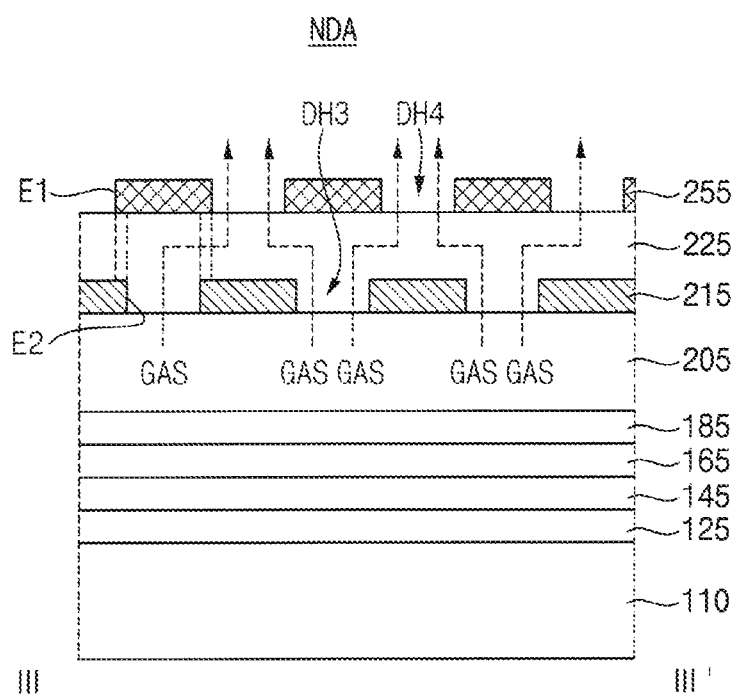
FIG. 8 is a cross-sectional view illustrating the display device taken along a line in FIG. 7.

FIG. 7 is a plan view illustrating the non-display area NDA in FIG. 5 that includes the first side portion SP1, the corner portion CP, and the second side portion SP2. For example, FIG. 7 may illustrate the corner portion CP or the second side portion SP2 in FIG. 5. FIG. 8 is a cross-sectional view illustrating the display device 100 taken along a line in FIG. 7.

Referring to FIGS. 5, 6, 7, and 8, the first conductive layer 215 may further include third discharge holes DH3. The third discharge holes DH3 may pass through the first conductive layer 215. The third discharge holes DH3 may be arranged at constant intervals in the first direction DR1 and the second direction DR2 in a plan view. In an embodiment, each of the third discharge holes DH3 may have a rectangular planar shape. However, the present invention is not limited thereto, and in another embodiment, the planar shape of each of the third discharge holes DH3 may be a polygonal shape, a circular shape, etc. other than the rectangular shape.

The third discharge holes DH3 may serve as a passage to discharge gas generated in the first organic insulating layer 205. The third discharge holes DH3 may be formed in the first conductive layer 215, so that the gas generated in the first organic insulating layer 205 may be discharged through the third discharge holes DH3.

The transparent conductive layer 255 may further include fourth discharge holes DH4. The fourth discharge holes DH4 may pass through the transparent conductive layer 255. The fourth discharge holes DH4 may be arranged at constant intervals in the first direction DR1 and the second direction DR2 in the plan view. In an embodiment, each of the fourth discharge holes DH4 may have a rectangular planar shape. However, the present invention is not limited thereto, and in another embodiment, the planar shape of each of the fourth discharge holes DH4 may be a polygonal shape, a circular shape, etc. other than the rectangular shape.

The fourth discharge holes DH4 may serve as a passage to discharge gas generated in the first organic insulating layer 205 and/or the second organic insulating layer 225. The fourth discharge holes DH4 may be formed in the transparent conductive layer 255, so that the gas generated in the first organic insulating layer 205 and/or the second organic insulating layer 225 may be discharged through the fourth discharge holes DH4.

The fourth discharge holes DH4 may not respectively overlap the third discharge holes DH3. Meaning, the fourth discharge holes DH4 do not substantially line up with the third discharge holes DH3 as illustrated in FIG. 4. In an embodiment, the third discharge holes DH3 and the fourth discharge holes DH4 may be alternately disposed in the plan view. For example, the third discharge holes DH3 and the fourth discharge holes DH4 may be alternately arranged along the first direction DR1. As illustrated in FIG. 8, edge portions E1 of the transparent conductive layer 255 may overlap with edge portions E2 of the first conductive layer 215.

In an embodiment, the first discharge holes DH1 in FIG. 3 and the second discharge holes DH2 in FIG. 3 may be disposed in the first portion PL1 of the power line PL, and the third discharge holes DH3 and the fourth discharge holes DH4 may be disposed in the second portion PL2 of the power line PL.

Compared with the first portion PL1 of the power line PL in which the first discharge holes DH1 and the second discharge holes DH2 overlapping each other are disposed as in FIGS. 3 and 4, in the second portion PL2 of the power line PL in which the third discharge holes DH3 and the fourth discharge holes DH4 not overlapping each other are disposed as in FIGS. 7 and 8, the gas generated in the first organic insulating layer 205 may not be relatively smoothly discharged through the third discharge holes DH3 and the fourth discharge holes DH4. However, because the second portion PL2 is farther from the display area DA than the first portion PL1, the effect of the gas generated in the second portion PL2 to the light emitting element EL disposed in the display area DA may be relatively small such that the non-overlapping arrangement also proves effective.

Compared with the first portion PL1 of the power line PL in which the first discharge holes DH1 and the second discharge holes DH2 overlapping each other are disposed, a surface area of the second portion PL2 of the power line PL in which the third discharge holes DH3 and the fourth discharge holes DH4 not overlapping each other are disposed may be relatively large. Accordingly, when the second portion PL2 of the power line PL contacts the opposite electrode 280 of the light emitting element EL, the contact resistance between the power line PL and the opposite electrode 280 of the light emitting element EL may decrease, and accordingly, a voltage drop and a delay of the power voltage provided by the power line PL to the opposite electrode 280 of the light emitting element EL may be prevented.

Figure 9:
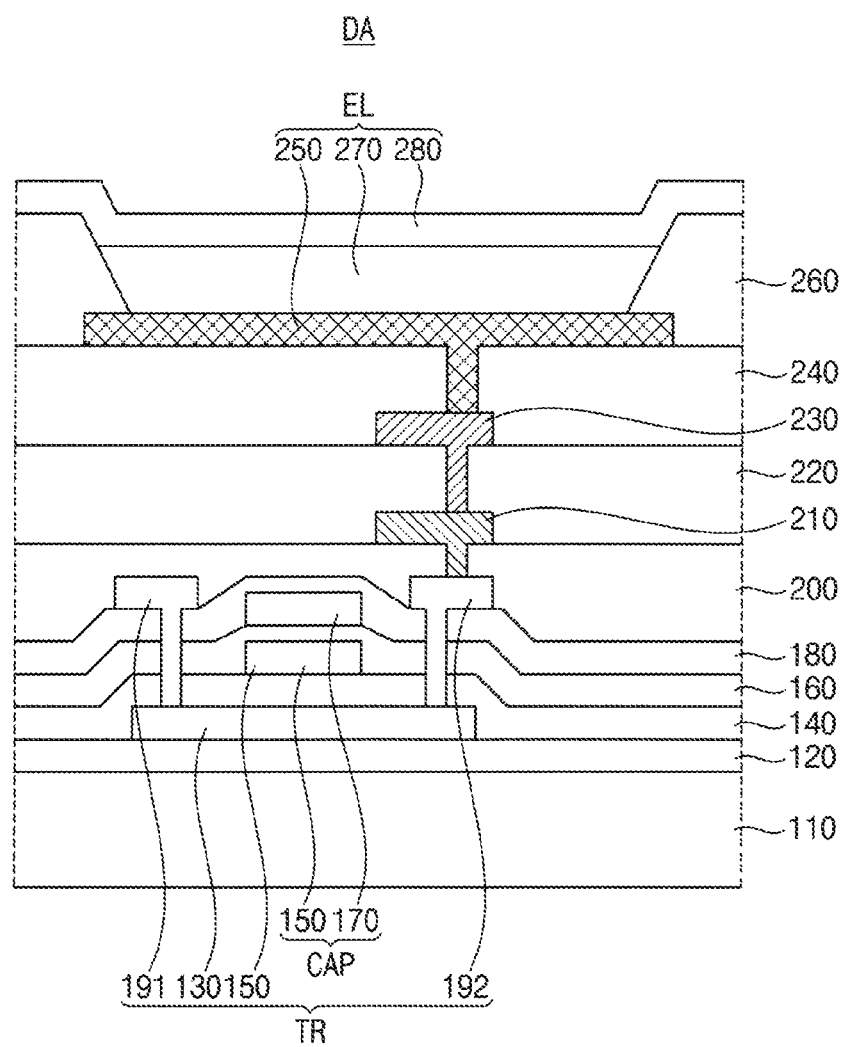

FIGS. 9 and 10 are cross-sectional views illustrating a display device according to another embodiment. FIGS. 9 and 10 may illustrate embodiments of the display area DA and the non-display area NDA of the display device 100 in FIG. 1, respectively.

Descriptions on elements of the display device described with reference to FIGS. 9 and 10, which are substantially the same as or similar to the display device described with reference to FIGS. 2 and 4, will not be repeated.

Referring to FIGS. 1 and 9, the display device 100 may further include a second connection electrode 230 and a third planarization layer 240 disposed in the display area DA.

The second connection electrode 230 may be disposed between the second planarization layer 220 and the pixel electrode 250. The second connection electrode 230 may connect the first connection electrode 210 and the pixel electrode 250. The second connection electrode 230 may be connected to the first connection electrode 210 through a contact hole formed in the second planarization layer 220.

The second connection electrode 230 may include a conductive material such as molybdenum (Mo), copper (Cu), aluminum (Al), titanium (Ti), or the like. In an embodiment, the second connection electrode 230 may include aluminum (Al) and titanium (Ti). For example, the second connection electrode 230 may have a multilayer structure including a titanium (Ti) layer, an aluminum (Al) layer, and a titanium (Ti) layer that are sequentially stacked.

The third planarization layer 240 may be disposed between the second connection electrode 230 and the pixel electrode 250. The third planarization layer 240 may cover the second connection electrode 230 on the second planarization layer 220. The third planarization layer 240 may have a flat upper surface. The third planarization layer 240 may include an organic insulating material such as polyimide (PI) or the like.

Referring to FIGS. 1, 9, and 10, the display device 100 may further include a second conductive layer 235 and a third organic insulating layer 245 disposed in the non-display area NDA.

The second conductive layer 235 may be disposed between the second organic insulating layer 225 and the transparent conductive layer 255. The second conductive layer 235 may include a conductive material such as molybdenum (Mo), copper (Cu), aluminum (Al), titanium (Ti), or the like. In an embodiment, the second conductive layer 235 may include aluminum (Al) and titanium (Ti). For example, the second conductive layer 235 may have a multilayer structure including a titanium (Ti) layer, an aluminum (Al) layer, and a titanium (Ti) layer that are sequentially stacked.

In an embodiment, the second conductive layer 235 may be disposed on the same layer as the second connection electrode 230. In such an embodiment, the material of the second conductive layer 235 may be substantially the same as the material of the second connection electrode 230.

The second conductive layer 235 may include fifth discharge holes DH5. The fifth discharge holes DH5 may pass through the second conductive layer 235. In an embodiment, each of the fifth discharge holes DH5 may have a rectangular planar shape. However, the present invention is not limited thereto, and in another embodiment, a planar shape of each of the fifth discharge holes DH5 may be a polygonal shape, a circular shape, etc. other than the rectangular shape.

The fifth discharge holes DH5 may serve as a passage to discharge gas generated from the first organic insulating layer 205 and/or the second organic insulating layer 225. The fifth discharge holes DH5 may be formed in the second conductive layer 235, so that the gas generated in the first organic insulating layer 205 and/or the second organic insulating layer 225 may be discharged through the fifth discharge holes DH5.

The fifth discharge holes DH5 may respectively overlap the first discharge holes DH1. In an embodiment, a width of each of the fifth discharge holes DH5 may be substantially equal to the width of each of the first discharge holes DH1. In such an embodiment, the fifth discharge holes DH5 may respectively overlap the second discharge holes DH2, and the width of each of the fifth discharge holes DH5 may be substantially equal to the width of each of the second discharge holes DH2.

The third organic insulating layer 245 may be disposed between the second conductive layer 235 and the transparent conductive layer 255. The third organic insulating layer 245 may cover the second conductive layer 235 on the second organic insulating layer 225. The third organic insulating layer 245 may include an organic insulating material such as polyimide (PI) or the like. In an embodiment, the third organic insulating layer 245 may be disposed on the same layer as the third planarization layer 240. In such an embodiment, the material of the third organic insulating layer 245 may be substantially the same as the material of the third planarization layer 240.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
   a substrate including a display area and a non-display area surrounding at least a portion of the display area;
   a first organic insulating layer disposed on the substrate in the non-display area;
   a first conductive layer disposed on the first organic insulating layer and including first discharge holes;
   a second organic insulating layer disposed on the first conductive layer; and
   a transparent conductive layer disposed on the second organic insulating layer and including second discharge holes that substantially entirely line up with the first discharge holes.

2. The display device of claim 1, wherein a width of each of the second discharge holes is equal to a width of each of the first discharge holes.

3. The display device of claim 1, wherein the first conductive layer includes aluminum (Al) and titanium (Ti).

4. The display device of claim 1, wherein the transparent conductive layer includes silver (Ag) and indium tin oxide (ITO).

5. The display device of claim 1, wherein each of the first organic insulating layer and the second organic insulating layer includes polyimide (PI).

6. The display device of claim 1, further comprising:
   pixels disposed on the substrate in the display area; and
   a power line disposed on the substrate in the non-display area, providing a power voltage to the pixels, and including the first conductive layer and the transparent conductive layer.

7. The display device of claim 6, wherein the power line includes a first portion spaced apart from the display area by a first distance and a second portion spaced apart from the display area by a second distance greater than the first distance, and
   wherein the first discharge holes and the second discharge holes are disposed in the first portion.

8. The display device of claim 7, wherein the first conductive layer further includes third discharge holes,
   wherein the transparent conductive layer further includes fourth discharge holes that do not respectively overlap the third discharge holes, and
   wherein the third discharge holes and the fourth discharge holes are disposed in the second portion.

9. The display device of claim 8, wherein the third discharge holes and the fourth discharge holes are alternately disposed in a plan view.

10. The display device of claim 8, wherein the non-display area includes a first side portion in which a pad connected to the power line is disposed, a corner portion extending from the first side portion and having a curved shape, and a second side portion extending from the corner portion and having a straight shape, and
    wherein the first portion is disposed in the first side portion.

11. The display device of claim 10, wherein the second portion is disposed in the corner portion.

12. The display device of claim 10, wherein the second portion is disposed in the second side portion.

13. The display device of claim 1, further comprising:
    a transistor disposed on the substrate in the display area;
    a first planarization layer disposed on the transistor;
    a first connection electrode disposed on the first planarization layer and connected to the transistor;
    a second planarization layer disposed on the first connection electrode;
    a pixel electrode disposed on the second planarization layer and connected to the first connection electrode;
    an emission layer disposed on the pixel electrode; and
    an opposite electrode disposed on the emission layer.

14. The display device of claim 13, wherein the first organic insulating layer is disposed on a same layer as the first planarization layer,
    wherein the first conductive layer is disposed on a same layer as the first connection electrode,
    wherein the second organic insulating layer is disposed on a same layer as the second planarization layer, and
    wherein the transparent conductive layer is disposed on a same layer as the pixel electrode.

15. The display device of claim 14, further comprising:
    a second conductive layer disposed between the second organic insulating layer and the transparent conductive layer and including fifth discharge holes that respectively overlap the first discharge holes; and
    a third organic insulating layer disposed between the second conductive layer and the transparent conductive layer.

16. The display device of claim 15, wherein the second conductive layer includes aluminum (Al) and titanium (Ti).

17. The display device of claim 15, wherein the third organic insulating layer includes polyimide (PI).

18. The display device of claim 15, further comprising:
    a second connection electrode disposed between the second planarization layer and the pixel electrode and connecting the first connection electrode and the pixel electrode; and
    a third planarization layer disposed between the second connection electrode and the pixel electrode.

19. The display device of claim 18, wherein the second conductive layer is disposed on a same layer as the second connection electrode, and
    wherein the third organic insulating layer is disposed on a same layer as the third planarization layer.

20. The display device of claim 14, wherein the transparent conductive layer is connected to the opposite electrode.

* * * * *